United States Patent [19]

Nash

[11] Patent Number: 4,903,097
[45] Date of Patent: Feb. 20, 1990

[54] CCD READ ONLY MEMORY

[75] Inventor: Greg Nash, Los Angeles, Calif.

[73] Assignee: Hughes Aircraft Company, Los Angeles, Calif.

[21] Appl. No.: 831,881

[22] Filed: Feb. 24, 1986

Related U.S. Application Data

[60] Division of Ser. No. 671,802, Nov. 15, 1984, Pat. No. 4,592,130, which is a continuation of Ser. No. 246,344, Mar. 23, 1981, abandoned, which is a division of Ser. No. 23,860, Mar. 26, 1979, abandoned.

[51] Int. Cl.$^4$ .................... H01L 29/78; G11C 19/28
[52] U.S. Cl. .......................................... 357/24; 377/60
[58] Field of Search ............................ 357/24, 57-63

[56]  References Cited

U.S. PATENT DOCUMENTS

| | | | |
|---|---|---|---|
| 3,654,499 | 4/1972 | Smith | 357/24 |
| 3,740,732 | 6/1973 | Frandon | 357/24 |
| 3,852,800 | 12/1974 | Ohwada et al. | 357/24 |
| 4,047,215 | 9/1977 | Frye et al. | 357/24 |
| 4,060,738 | 11/1977 | Tasch et al. | 357/24 |
| 4,072,977 | 2/1978 | Bate et al. | 357/24 |
| 4,112,575 | 9/1978 | Fu et al. | 357/24 |
| 4,164,751 | 8/1979 | Tasch et al. | 357/24 |
| 4,215,357 | 7/1980 | Kohyama et al. | 357/24 |

OTHER PUBLICATIONS

D. Frohman & Bentchowsky, "The Metal–Nitride–Oxide–Silicon (MNOS) Transistor–Characteristics and Applications," Proceedings of the IEEE, vol. 58, No. 8, Aug. 1970, pp. 1207–1219.
D. Frohman & Bentchowsky, "A Fully Decoded 2048-Bit Electrically Programmable FAMOS Read-Only Memory," IEEE Journal of Solid-State Circuits, vol. SC-6, No. 5, Oct. 1971, pp. 301–306.
K. Goser & K. Knauer, "Nonvolatile CCD Memory with MNOS Storage Capacitors," IEEE Journal of Solid State Circuits, vol. SC-9, No. 3, Jun. 1974, pp. 148–150.
Y. T. Chan et al, "Charge–Coupled Memory Device," Applied Physics Letters, vol. 22, No. 12, 15 Jun. 1973, pp. 650–652.
Marvin H. White et al, "A Nonvolatile Charge-Addressed Memory (NOVCAM) Cell", IEEE Journal of Solid–State Circuits, vol. SC-10, No. 5, Oct. 1975, pp. 281–287.
Sequin et al, "Charge Transfer Devices", Academic Press, New York 1975, pp. 39–61.
J. Grinberg et al, "Liquid Crystal Electro-Optical Modulators for Optical Processing of Two-Dimensional Data", SPIE vol. 128, Effective Utilization of Optics in Radar Systems, 1977, pp. 253–266.
J. McKenna et al, "Design Considerations for a Two-Phase, Buried Channel, Charge-Coupled Device", *The Bell System Tech. Journal*, pp. 1581–1597, vol. 53, No. 8, Oct. 1974.

*Primary Examiner*—Gene M. Munson
*Attorney, Agent, or Firm*—P. M. Coble; W. K. Denson-Low

[57]  ABSTRACT

The specification describes a high capacity nonvolatile CCD read only memory system that includes a plurality of memory cells. Selected ones of the memory cells include a double-diffused region having a first and second implant or diffusion under a clocked electrode whereby the first implant or diffusion provides a fixed charge required for ROM operation and the charge and polarity of said second implant or diffusion provides a neutralizing effect on the surface potential under the clocked electrode and above the double implanted or double diffused region.

8 Claims, 6 Drawing Sheets

CCD READ ONLY MEMORY

This is a divisional of application Ser. No. 671,802, filed on Nov. 15, 1984, which has issued as U.S. Pat. No. 4,592,130. The parent application of the present application was a continuation of application Ser. No. 246,344, filed Mar. 23, 1981 and now abandoned, which was a divisional application of Ser. No. 023,860, filed Mar. 26, 1979, and now abandoned.

BACKGROUND OF THE INVENTION

The invention relates generally to Metal-Oxide-Silicon (MOS) Read-Only Memories (ROMs) and more particularly to nonvolatile MOS charge coupled memory devices.

There are two basic classes of solid state read only memories (hereinafter referred to as ROMs)-namely, random access memories and serial access memories. Random access MOS ROMs are generally well known. They typically consist of a matrix of Metal-Oxide-Silicon-Field-Effect Transistors (MOSFETs) that have been constructed with an alterable threshold voltage which is used to electrically indicate the storage of a binary "1" or "0". The second class of ROMs, i.e., serial access memories are not known to be presently commercially available as MOS devices.

A typical solid-state random access ROM is a MNOS (Metal Nitride Oxide Semiconductor) memory device such as described by Dov Frohman and Bentchowsky in *Proceedings IEEE*, Vol 58, August 1970 pages 1207-1219. The MNOS structure described in this publication is configured in the form of a field-effect transistor fabricated on a semiconductor substrate having an insulated gate electrode and source and drain terminals that "current access" the stored charge in the transistor. A composite insulating layer disposed between the gate electrode and the semiconductor substrate of the transistor consists of a thin layer of silicon oxide on which a layer of silicon nitride has been applied. By applying a voltage pulse on the gate electrode, charge carriers are transported from the semiconductor substrate to the thin silicon oxide layer by means of a phenomenon known as tunnelling. The number of charge carriers trapped at the interface of the silicon oxide layer and the silicon nitride layer determines the threshold voltage of the transistor, which voltage in turn controls the magnitude of the current flow between the source and drain terminals for a specified read voltage on the gate electrode. However, the problem encountered with this prior MNOS structure is that it requires at least one transistor per bit of binary information, so that the packing density is very small and limited.

Another method of determining the threshold voltage of a field-effect transistor gate in the above type of MNOS structure is by injection of charge created during an avalanche breakdown in the semiconductor substrate of tee transistor. A semiconductor memory device using this principle is known in the art as a FAMOS (Floating-Gate Avalanche Metal Oxide Semiconductor) structure, and one such structure of this type is described by Dov Frohman and Bentchowsky in *IEEE Journal of Solid-State Circuits*, Vol. SC6, October, 1971, pages 301-306. The device described in the latter publication is a field-effect transistor with a source, a drain, and an insulated floating gate electrode in the form of a nonconnected conductive layer which is usually surrounded by insulating material and disposed above the surface of the semiconductor substrate. By applying a reverse bias of sufficient magnitude across the source substrate PN junction or the drain-substrate PN junction to produce avalanche breakdown, charge carriers are generated at the junction. On account of the electrical field applied across the PN junction at reverse breakdown, the energy of these charge carriers reaches a high level such that these carriers are capable of travelling from their energy band in the semiconductive substrate to a corresponding energy band in the insulating layer below the gate electrode. Such charges travelling in the insulating layer near the floating gate electrode will therefore charge this electrode. Thus, during operation of this FAMOS type device, electrons can move from the conduction band in the semiconductor substrate to the conduction band in the insulating layer. Conversely, holes of the valence band in the semiconductor substrate may shift to the valence band in the insulating layer. However, once again the important drawback of this latter avalanche injection structure is the inefficient packing density which results from the requirement of one transistor per bit to be stored in the structure.

An alernate method of cell operation frequently used in connection with a MNOS memory device of the above type is charge addressing the MNOS structure. This operation is accomplished by controlling the silicon oxide electric field strength and current density of the device which is dependent upon the magnitude of signal charge beneath a deep depleted MNOS capacitor formed by the device. In operation, the surface potential of this capacitor is collapsed and the silicon oxide electric field strength increases with an increase in silicon oxide tunnelling current. The transfer of signal charge from the device is typically accomplished using an output charge-coupled device (CCD). The combination of charge transfer and MNOS principles for signal control, address, and nonvolatile storage for this latter type of device has been set forth by K. Goser and K. Knaver in *IEEE Journal of Solid-State Circuits*, SC-9, pages 148-150, June 1974 and by Y. T. Chan et al in *Applied Physics Letters*, Vol. 22, pages 650-652, 15 June 1973. The charge storage sites of these MNOS structures are located inside a stepped dielectric 2-phase or 3-phase CCD shift register.

This latter MNOS device also has a poor packing density and an inadequate charge handling capability, both of which result in poor write characteristics and ineffective write/inhibit operation for the device. Additionally, high voltage clocks required for good transfer efficiency in these devices cause spurious write operation and poor read operation due to the large access time to the first stored bit, and these characteristics tend to degrade memory retention caused by small write and read disturbance effects.

A ROM CCD device that has a higher packing density than all of the above-identified prior art structures is a nonvolatile charge-addressed memory (NOVCAM) cell with parallel write and read-out injection for block-oriented random-access memory (BORAM) applications as set forth, for example, by White et al, in the *IEEE Journal of Solid-State Circuits*, Vol. SC10, No. 5, October 1975. The NOVCAM cell described in this publication comprises a combined CCD shift register and a thin-oxide MNOS memory structure to provide a higher packing density. However, the charge transfer efficiency of this latter device is severely degraded by the thin oxide at the MNOS surface, and therefore this circuit is not well suited for ROM CCD operation with high charge transfer efficiency.

SUMMARY OF THE INVENTION

The general purpose of this invention is to provide a new and improved CCD ROM structure that has a higher packing density than the NMOS and FAMOS static ROM and the charge addressed CCD described above, and further has improved operating characteristics (e.g., higher transfer efficiency) relative to the NOVCAM cell described above. To accomplish this purpose, I have discovered and developed a CCD ROM structure which comprises a plurality of adjacent CCD memory cells including intermediate CCD cells between an input cell and an output cell. Each memory cell includes predefined adjacent surface portions of a semiconductor substrate of a first conductivity type and separate pluralities of clocked electrodes selectively spaced above the substrate portions. The electrodes are responsive to clocking signals so as to produce and define, when energized, a series of selectively spaced regions of fixed charge in the semiconductor substrate. Chosen ones of the memory cells further include a fixed charge region defined by either a first diffusion or ion-implantation of the opposite or second conductivity type impurity in the substrate directly beneath the last electrode within a memory cell. This fixed charge region further includes a second diffusion or ion-implantation directly adjacent to the first implantation or diffusion and of the same conductivity type as, and of higher carrier concentration than, the substrate. The fixed charge region produced by the first diffusion or implantation provides a fixed charge representative of binary information required for read only memory operation. The second region produced by the second diffusion or implantation provides a neutralizing effect on the first diffusion or implantation such that the first region does not significantly and adversely affect the surface potential of the CCD under the last electrode of any given memory cell.

The ROM structure of the present invention may be utilized in a system having an input circuit which supplies charge representative of an input signal to the input cell, and also having an output circuit which converts the charge from the output cell into an appropriate output signal. The system further includes a refreshing means for feeding back the output signal to the input circuit thereof.

The CCD structure of this invention can also be operated as a non-memory CCD, such as a conventional delay line, by disconnecting the refreshing means of the system. Input information can then be clocked serially through the structure from the input circuit to the output circuit.

Accordingly, it is an object of the present invention to provide a new and improved non-volatile CCD read only memory cell.

Another object of this invention to provide a non-volatile CCD memory structure of the type described which is capable of a high charge storage density while maintaining a relatively high charge transfer efficiency.

A further object of this invention is to provide a non-volatile CCD memory cell of the type described that can perform as a non-memory, linear CCD when it is not connected with feedback as a read only memory.

A novel feature of this invention is the provision of a CCD ROM structure on and in a first conductivity type substrate, including a plurality of adjacent CCD memory cells in the substrate, wherein selected ones of the cells include a fixed charge region defined by a first diffused or ion-implanted region of a second conductivity type, and a second diffused or ion-implanted region of the first conductivity type directly adjacent the first region. This second region has a higher carrier concentration than that of the substrate. The first diffused or ion-implanted region provides a fixed charge representative of certain ROM information and the second diffused or ion-implanted region provides a neutralizing effect on the surface potential of the CCD above the first and second regions, defined above, and thus tends to offset the effect that the charge of the first diffused or implanted region has on this surface potential.

BRIEF DESCRIPTION OF THE DRAWINGS

FIG. 1b is a schematic diagram of clocking circuitry which may be used in combination with the device of FIG. 1a;

FIG. 4a is an equivalent circuit of the CCD of FIG. 3a;

DETAILED DESCRIPTION OF THE PREFERRED EMBODIMENT

Figure 1A:
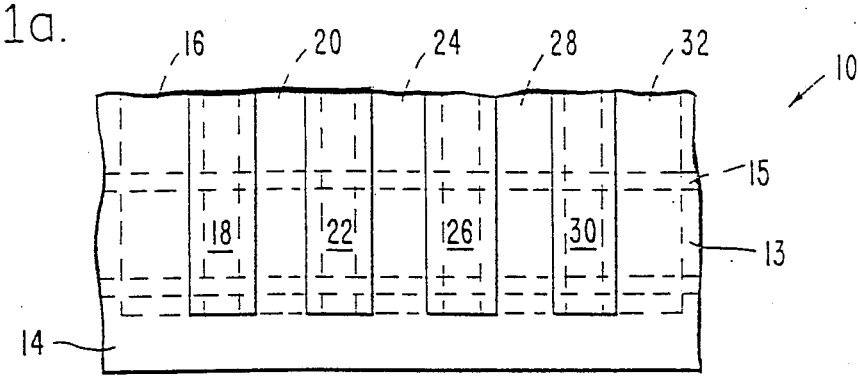
FIG. 1a is a partial plan view of a non-volatile CCD ROM fabricated in accordance with the present invention.
Figure 1B:
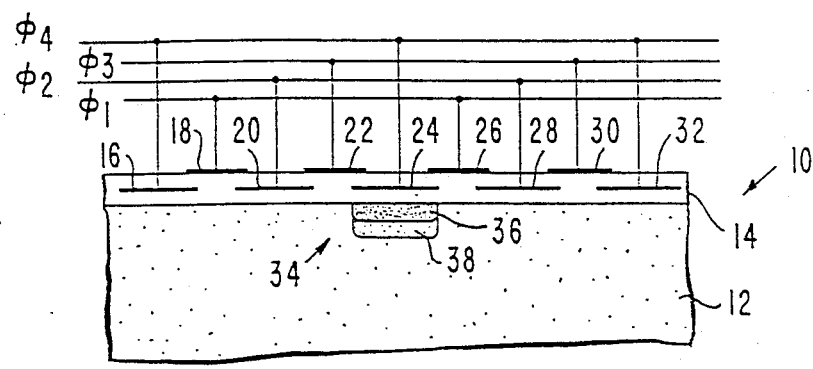
Figure 2:
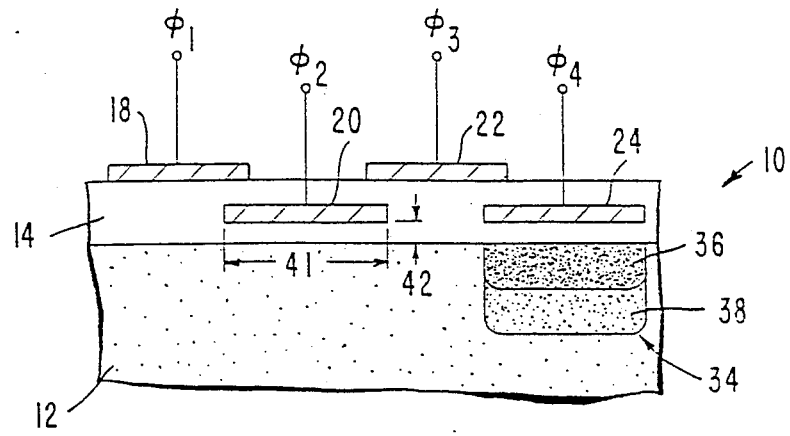
FIG. 2 is an enlarged cross sectional view of one CCD ROM cell used in FIGS. 1a and 1b.
Figure 7:
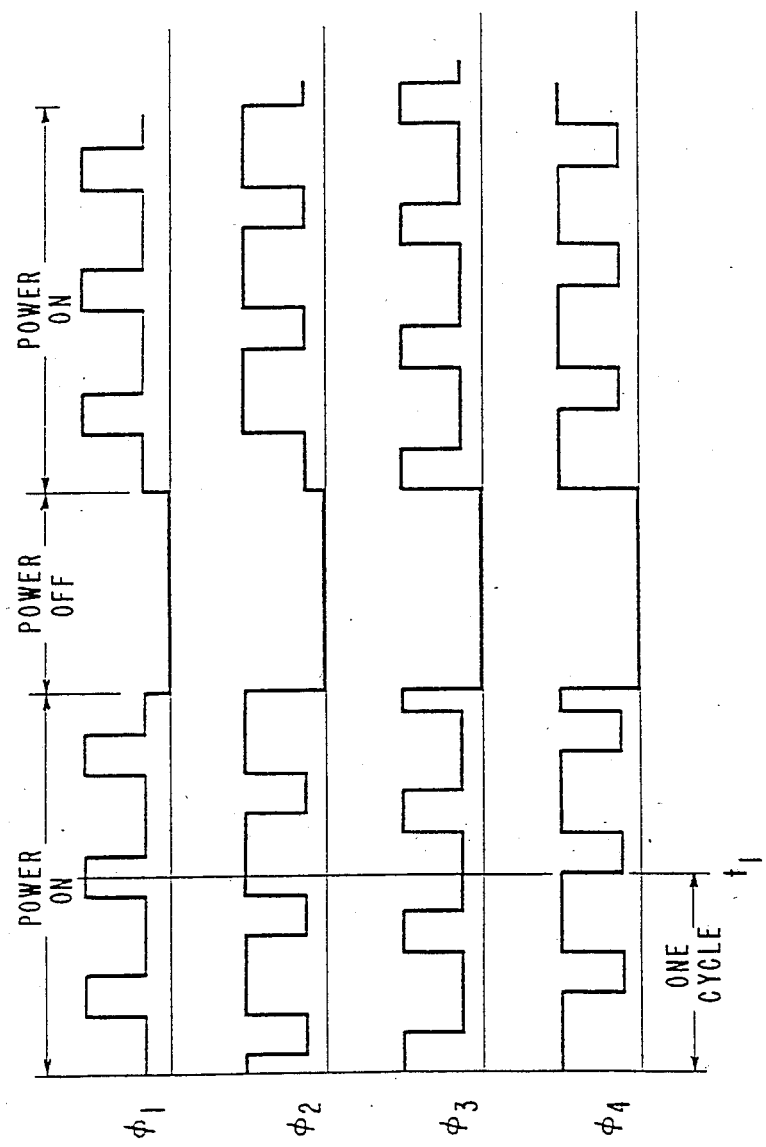
FIG. 7 is a clocking diagram illustrating the voltages applied to the electrodes of FIGS. 1b, 2, 3a and 6.

Referring first to FIGS. 1a, 1b and 2, a CCD shift register is formed in a semiconductor substrate 12 having a thin layer of oxide 14 deposited on its top surface. Buried in the oxide layer 14 and distributed along its surface are a plurality of individual clocking or addressing electrodes 18, 22, 26 and 30 to which potentials are applied to move charges from left to right, from one potential well (not shown) in the substrate 12 to the next. The charges are introduced (injected) into the CCD 10 by suitable input circuitry (not shown), and these injected charges are confined within a channel 13 formed in the substrate 12 and bounded by a pair of P+ channel stops 15. A $\phi_1$ clocking signal from a suitable clock source is applied to electrodes 18 and 26, a $\phi_2$ clocking signal is applied from a second appropriate clock source to electrodes 20 and 28, a $\phi_3$ clocking signal is applied to electrodes 22 and 30, and a $\phi_4$ clocking signal is applied to electrodes 16, 24 and 32. The exact phase relationships of clocking signals $\phi_1$–$\phi_4$ are shown in FIG. 7 which is described in more detail below. While the CCD device of the above-described embodiment has been structured so as to respond to four separate clocking signals, it may be suitably modified to respond to any number of clocking signals.

Referring more specifically to FIGS. 1b and 2, the CCD 10 further includes a double implanted or double diffused region 34 directly beneath the last clocked electrode 24 (in a clock cycle) for one ROM cell in the substrate 12. The doping (impurity concentration) of the first implant or diffusion 36 of the fixed charge region 34 is chosen such that it is opposite in polarity (conductive-type) to both the polarity of the substrate 12 and the polarity or conductivity-type of a second implant or diffusion 38. More specifically, if a P type material is chosen for the substrate 12, then the implant 36 will have an N type conductivity and the implant 38 will have a P type conductivity. The first N planar region 36 stores binary information in the form of a fixed charge which has been introduced by impurity diffusion or ion-implantation into the substrate 12 using conventional MOS planar processing procedure including well-known lithographic masking and etching techniques which form no part of this invention. Of course, the conductivity types can be reversed with the substrate 12 having an N type conductivity and implants or diffusions 36 and 38 being P type and N type respectively.

Figure 3A:
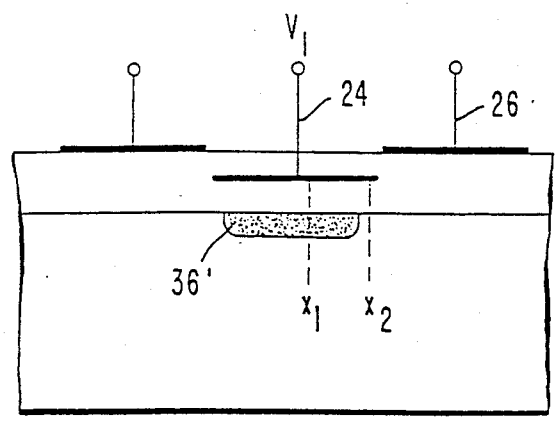
FIG. 3a is a cross-sectional view of a CCD with one implant of a conductivity-type opposite to that of the substrate.
Figure 3B:
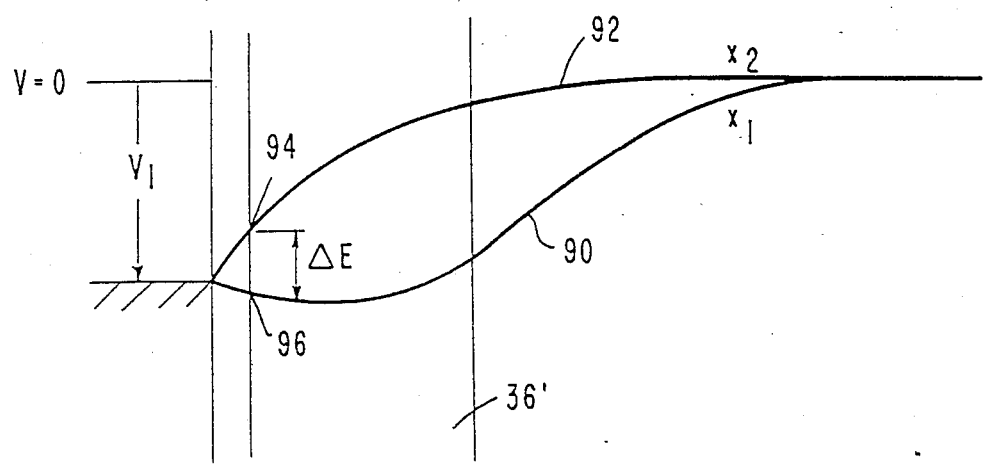
FIG. 3b is a plot of the surface potential beneath the electrode over the implant of two positions in FIG. 3a for an applied voltage.

The first or upper doped region 36 has a certain amount of electron charge, Q, corresponding to the stored binary information in the CCD. For proper CCD operation, this charge must be serially clocked from gate to gate along the length of the CCD structure and beneath the clocking electrodes thereof. However, the first implant or diffusion 36 alters the electrical potential profile underneath gate electrode 24 (in a manner to be described), such that if only a single diffusion or implant 36' were used, as indicated in FIG. 3a, there would be an intolerable impedance to charge transport laterally across the CCD structure. Thus, if a voltage $V_1$ is applied to the gate electrode 24 in FIG. 3a, the surface potential along the dimension $X_1$ under the gate electrode 24 and through the region 36' into the substrate is illustrated by curve 90 in FIG. 3b. The adjacent potential beneath the outer edge of gate electrode 24 along the dimension $X_2$ and exterior to region 36' is illustrated by curve 92 in FIG. 3b. In order to clock the charge Q laterally across the CCD structure in the standard CCD mode of operation, the point 94 at which the potential curve 92 intersects the SiO$_2$ interface should be equal to the point 96 at which curve 90 intersects the SiO$_2$ interface. However, using only a single implant 36' there will be an energy barrier of height $\Delta E$ preventing the flow of charge from the implant region 36' to a substrate region beneath an adjacent gate 26.

This energy barrier $\Delta E$ occurs because the implant 36' causes the CCD structure to act like a buried channel CCD (BCCD), whereas the remaining portions of the CCD structure function as a surface channel CCD (SCCD). As is known in this art, charge-transfer from a buried channel to a surface channel is not possible using standard gating schemes. This principle is set forth in a publication entitled "Liquid-Crystal Electro-Optical Modulators For Optical Processing of Two-Dimensional Data" by J. Grinberg et al, SPIE Vol. 128, *Effective Utilization of Optics in Radar Systems,* 1977, pp. 253–266.

Figure 3C:
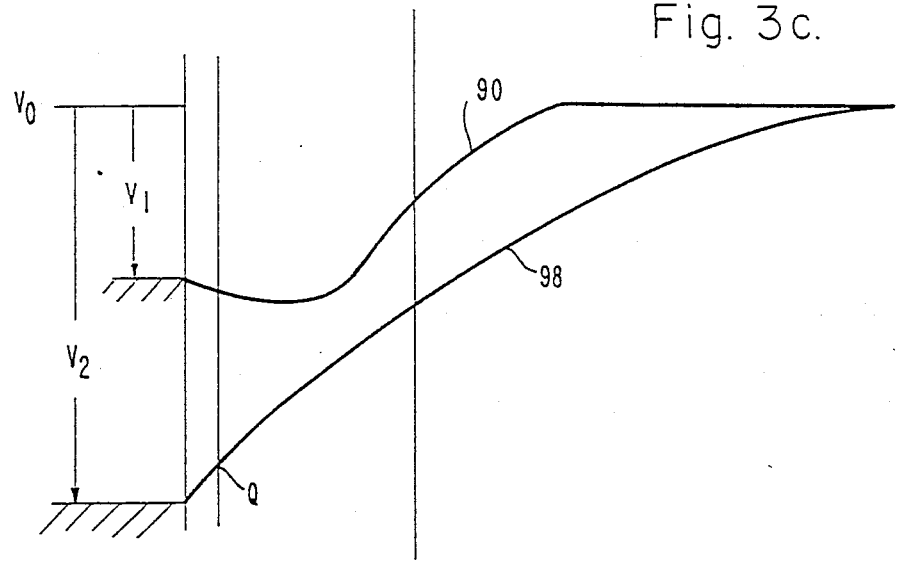
FIG. 3c is a plot of the surface potential beneath the electrode of the CCD Of FIG. 3b to which a larger voltage than in FIG. 3b has been applied.

One method for transferring charge between a buried channel CCD and a surface channel CCD is to apply a relatively large voltage $V_2$ to the electrode 24 of FIG. 3a and thus substantially alter the potential profiles in the underlying semiconductor material. This principle is discussed in some detail in a publication entitled "Design Considerations for a Two-Phase, Buried-Channel, Charge-Coupled Device", *The Bell System Technical Journal,* Vol. 53, No. 8, October 1974, pp. 1581–1597. Using this technique, a relatively large voltage $V_2$ which is higher than $V_1$ may be applied to the same CCD electrode 24 to thereby raise the potential 90 under the electrode 24 until the charge Q reaches the surface of the semiconductor substrate 12 as illustrated by curve 98 in FIG. 3c. At this time, the charge in the buried channel 36' will flow along the surface of the substrate 12. This alteration in substrate potential profiles will overcome the above-described charge transfer problems between the buried and surface channels of the CCD structure.

Figure 4A:
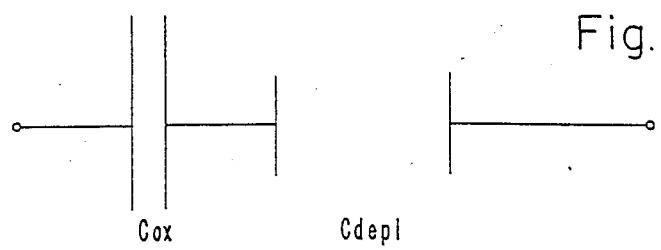

On the other hand, the voltage required to transfer charge from a single implant 36' and along the surface of the substrate 12 is quite large for all conventionally doped CCD structures and therefore renders this latter technique an impractical solution to the above charge transfer problem. To illustrate this point, the CCD structure in FIG. 3a can be represented by two capacitors $C_{ox}$ and $C_{depl}$ which are connected in series as shown in FIG. 4a. The capacitor $C_{ox}$ correponds to the CCD oxide capacitance and is relatively large, since the oxide thickness is small. The second capacitor, $C_{depl}$, models the back-biased PN junction at the region 36'—substrate interference and this latter capacitance is relatively small because the depletion width of this PN junction is very large. Thus, the total capacitance $C_{total}$ of the series combination $C_{ox}$ and $C_{depl}$ is also very small, and hence a large voltage (100 volts) is necessary to pull the electron charge to the surface, i.e.:

$V=Q/C_{total}$ and overcome the above described charge transfer problem.

Figure 4B:
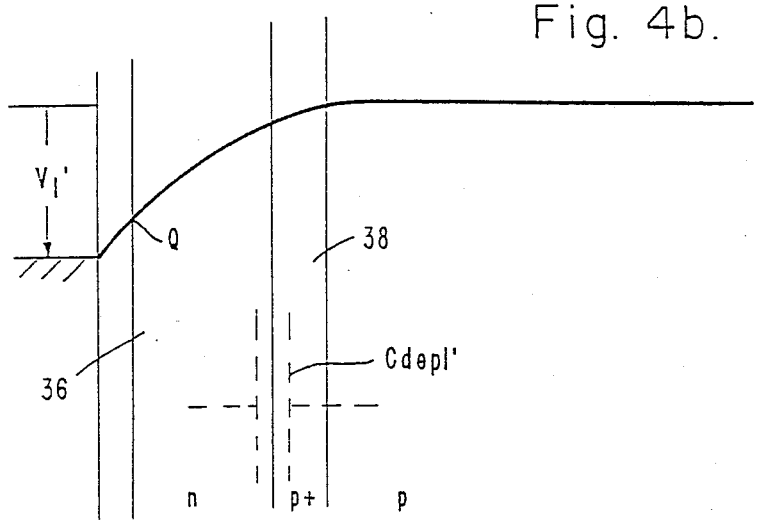
FIG. 4b is a plot of the potential beneath the electrode as a function of distance into the substrate, with the presence of two implants.

However, in accordance with the present invention, it has been discovered that the above-described problems of buried channel to surface channel energy barriers and their respective impedances to charge transfer may be alleviated by the creation of the second, P implanted or diffused region 38 directly beneath the N surface region 36 as shown in FIG. 4b. Now, rather than having the PN junction depletion region capacitance $C_{depl}$ determined by an NP junction (where the P doping is that of the substrate), it is instead determined by a junction which, as a result of the increased P doping concentration adjacent to the N type region, has a significantly increased junction capacitance, $C_{depl}'$. This increase in $C_{depl}$ to a new value of $C_{depl}$ as indicated in FIG. 4b causes the profile of charge (Q) versus distance into the semiconductor substrate to assume the new contour indicated in the latter figure. Thus, with the two doped regions 36 and 38 present in the substrate 12, a much smaller voltage $V_1'$, typically on the order of 2 volts, is sufficient to pull all of the charge Q to the silicon-silicon oxide interface and enable the structure to be operated as a surface channel CCD.

Thus, there has been described a novel double diffused or double implanted CCD memory which is operable as a surface channel device, and this new and improved structure overcomes the problems described above associated with buried-to-surface channel types of charge transfer. In order to optimize charge transfer efficiency in the CCD ROM cell, the above dose and position of the second doped region 38 is adjusted to produce the same net surface potential for the composite double-implanted region 34 as would have been the case without either of the two implants 36 and 38.

Referring now to FIG. 5a, a hypothetical doping concentration $\rho$ of the CCD cell in FIG. 2 is illustrated as a function of distance X into the substrate 12 under the electrode 24. The doping profiles for the doped regions 36 and 38 are represented by the dashed lines 46 and 48. The solid line 44 represents the background doping concentration in the surrounding portions of the substrate 12. As previously described, the doping concentration of the implantation 38 is chosen to counterbalance any effect on the CCD operation caused by the N impurity concentration of the implantation 36. The implant 38 is of the same conductivity-type as the substrate 12, but much higher in doping concentration. Both of the ion-implants 36 and 38 are concentrated near the surface of the substrate 12.

FIG. 5b illustrates the contour of the electric field, E, (i.e., E-field profile) produced by the application of a fixed voltage to the clock electrode 24 above the doped regions 36 and 38.

As shown in FIG. 5b, the E-field varies as a function of the integral of the doping concentration, $\rho$, and along a dimension through the doped regions 36 and 38 and the underlying substrate 12. The solid line profile 50 illustrates the plot of the electric field in the absence of the implants 3 and 38, and the dashed line 52 is an integral of the relatively constant N and P type doping concentrations 46 and 48 in FIG. 5a.

Figure 5:
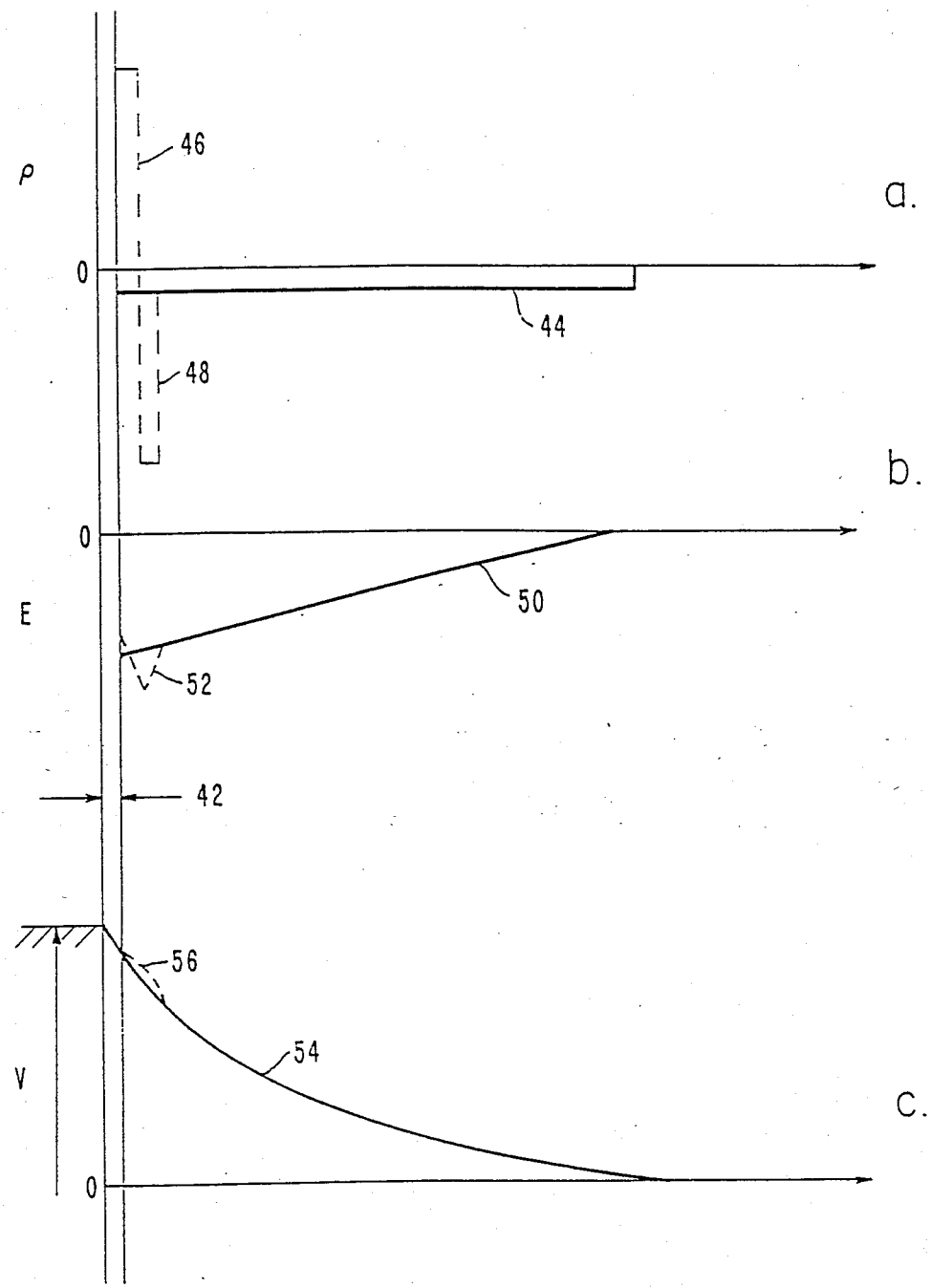
FIG. 5a is a plot of the doping concentration of the CCD ROM cell in FIG. 2 versus distance into the semiconductor substrate in which the cell is formed.
FIG. 5b is a plot of the electric field profile for the CCD ROM cell in FIG. 2.
FIG. 5c is a plot of the surface potential beneath the clocking electrode for the CCD ROM cell of FIG. 2 versus distance into the semiconductor substrate.

The substrate surface potential is illustrated in FIG. 5c and is an integral of the electric field, E, i.e., $V = \int E(X)dX$, where "X" is the distance into the substrate. The purpose of FIG. 5 is to show that the effect of the total integration represented by the dashed line 52 in FIG. 5b on the surface potential V of the CCD memory cell is represented by the dashed line 56 in FIG. 5c. Thus, whereas the surface potential V in FIG. 5c for an undoped substrate 12 varies along the parabolic contour of the solid line 54 and into the substrate, the double doped substrate will now have a surface potential V which varies along the inverted parabolic contour 56 which is the integral of the E field profile 52 in the doped regions 36 and 38. The net result is that the integration represented by the curve portion 56 has a negligible effect on the surface potential V of CCD memory cell, and this is a desirable feature provided by the present invention.

Figure 6:
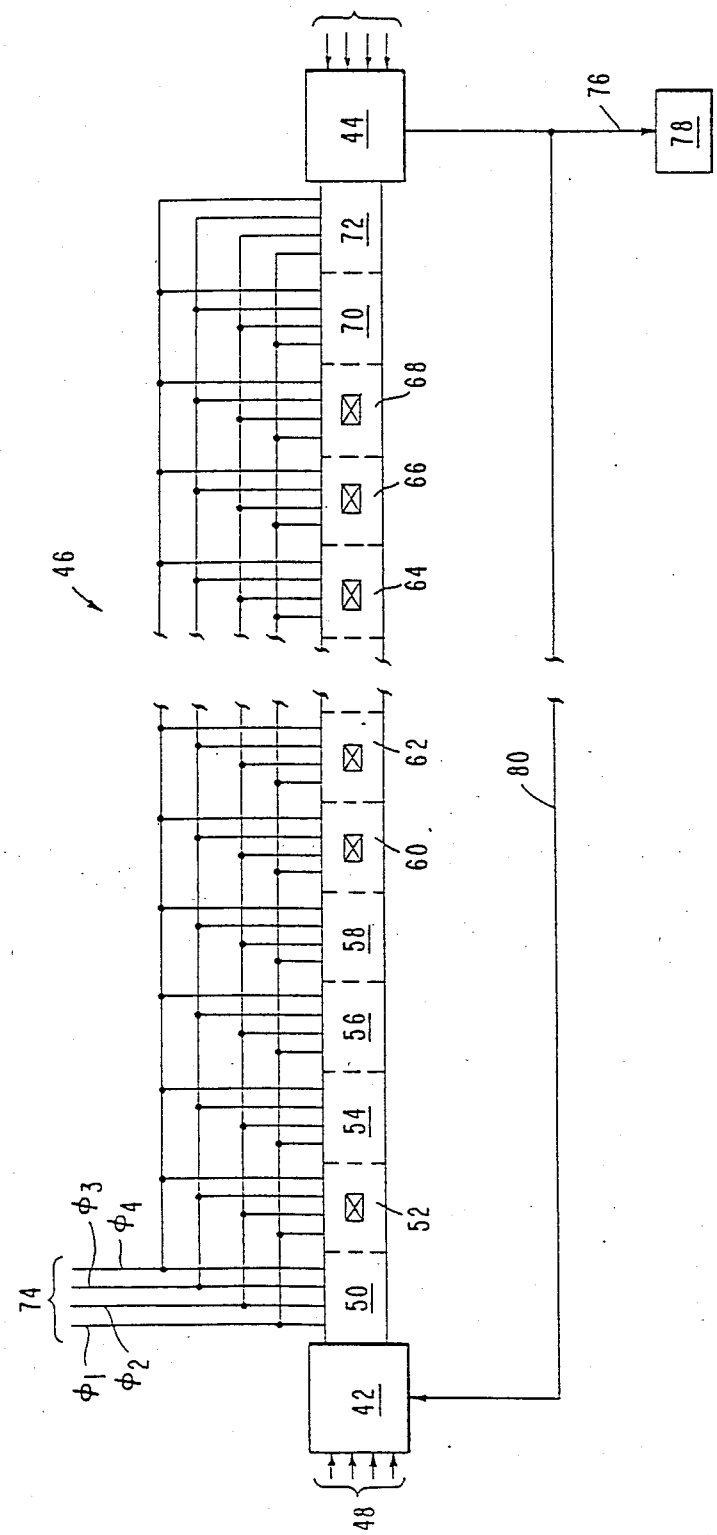
FIG. 6 is a plan view of a charge transfer system incorporating a plurality of non-volatile CCD ROMS constructed in accordance with FIGS. 1b and 2 above.

Referring now to FIG. 6, a charge injection input circuit 42 of a type known and available in the art, such as in the publication of *Charge Transfer Device*, by C. Sequin and M. Tompett, Academic Press, Inc. New York, 1975, pp. 47-61, supplies charge which is fed into a first ROM cell 50 of the CCD ROM structure 46. The serially connected CCD cells 50-72 are adapted to receive the clocking signals $\phi_1-\phi_4$ of the four different phases indicated in FIG. 7, and these clock signals are available from a clocking source 74. During fabrication of the serially connected CCD cells 50 through 72 on a single substrate, bits of binary information were stored as full potential wells of charge in predetermined ones of these CCD cells. These cells 52, 60-68 contain an "x" representing stored binary "1's", and these cells are similar to the CCD cell in FIG. 2 and contain the double implanted or double diffused region 34 which stores the charge representative of a binary "1". The remaining cells 50, 54-58 and 70-72 that contain no fixed charge represent the binary "0's" for the charge processing circuitry of FIG. 6.

The start up procedure for the CCD memory system 46 in FIG. 6 is to apply the $\phi_1-\phi_4$ voltages from clocking the source 74 in the phase relationship shown in FIG. 7, so that four electrodes in each CCD memory cell will receive one of the four $\phi_1-\phi_4$ clocking signals. During each cycle of the clocking voltages $\phi_1-\phi_4$, charge is transferred from one CCD cell 50-72 to the adjacent CCD cell to the right as shown in FIG. 6. The output circuit 44 senses the charge in the last or output CCD cell 72 and converts it to a signal which is then applied to the input circuit 42 by feedback means 80. The feedback means 80 is preferably a bus line which serves to connect a refresh signal back into the first CCD memory cell 50. Therefore, the input circuit 42 is also a charge refreshing circuit in that it responds to both a feedback signal as well as a plurality of input signals 42.

The signal from the output circuit 44 is also supplied to an output bus 76 so that it can be further processed by an output utilization circuit 78 such as Ibid., pp. 41-61. The 12-bit binary number 00111...1100010 is read out in the sequence indicated in the output circuit 44, which receives this sequential binary information from the last (twelfth) CCD cell 72. This binary number is dependent upon the fixed charge (or absence thereof) state of each of the eleven cells shown in FIG. 6, and the number of bits in the binary number and the number of CCD cells will be the same. The duration of each binary bit, which may be digital information visible on a CRT or the like, i.e., block 44, corresponds to the duration of each clock cycle which is defined, for example, as time $t_1$ in FIG. 7. Thus, the read-out of the above 12-bit binary number is completed after twelve successive clock cycles, i.e., at time $t_{12}$, and then the cycle starts over after the information is refreshed.

This CCD structure and clocking circuitry shown in FIG. 6 is connected for use as a ROM. Once the stored data has begun to circulate (using the refresher feedback connection 80), the CCD functions in a known manner by transferring charge from one potential well to an adjacent potential well. In some instances, however, it may be desirable to disconnect the fixed charge ROM cells from the circuitry of FIG. 6 and operate this circuitry as a standard serial CCD. This may be accomplished by applying an external data signal to the input circuit 42 rather than applying the signal from the refresher. During this time the original stored information will be temporarily lost.

When the original stored information needs to be retrieved from the ROM memory of FIG. 6, either because the structure has been processing new charge or because the power has been turned off, it may be done by either one of two methods. The first method is to turn the CCD structure in FIG. 6 off by shutting down the power applied thereto and allowing charge to thermally accumulate in the device. During this period, the potential wells that had been originally filled with charge will return to their equilibrium state i.e., fill with charge. This action is due to the excess electrons that are created by heat generation that are floating around in the system. The only requirement for turning on the system again is to allow enough time to pass after the ROM CCD is deenergized so that the implanted or diffused regions therein can fill up with the thermally induced charge. After such sufficient length of time has passed, charge will become concentrated only in the double implanted or double diffused regions and the CCD can be turned on again, containing the original stored information. The other way to retrieve the ROM information in the structure of FIG. 6 is to apply a momentary input signal to all of the CCD cells. The charge in the structure of FIG. 6 will instantly concentrate in the double doped regions in the ROM CCD cells therein. This second method is preferred in cases where the stored information is needed instantaneously, particularly since the thermal relaxation rate is relatively slow in the first method described above for information retrieval.

An example of an N channel silicon ROM cell, in accordance with the invention, may have (and is not limited to) the following parameters. The substrate would have a resistivity between 0.1 and $10^4$ ohm cm and a P type doping of $1 \times 10^{15}$ cm$^{-3}$. The first implant would have an N type arsenic implantation (the dose being $X1 \times 10^{12}$ cm$^{-2}$) leaving a doping concentration of $1 \times 10^{16}$ cm$^{-3}$ from silicon-silicon oxide interface to 1,000 Å deep in the substrate. The second implant would have a P type boron implantation (the dose being $\chi 1 \times 10^{12}$ cm$^{-2}$) leaving a doping concentration of $1 \times 10^{16}$ cm$^{-3}$ from 1000Å to 2000Å deep in the substrate. The lateral dimensions of these implants would correspond to the area of the storage gate 24. (The alignment of the implant with respect to the storage gate is not critical.) The silicon wafer orientation should be (1 0 0) as used or standard NMOS technology.

Thus, there has been described a dynamic serial CCD ROM cell and associated structure and clocking structure which has an inherently larger packing density than known prior art solid state random access memories, such as the MNOS and FAMOS memories described above. In addition, the present ROM CCD memory exhibits certain improved operating characteristics and can function as a standard serial CCD without memory if desired.

Although the invention has been described with reference to particular embodiment thereof, it should be realized that various changes and modifications may be made therein without departing from the spirit and scope of the invention.

What is claimed is:

1. A read-only memory (ROM) structure for providing nonvolatile storage of binary information, said structure comprising:
    (a) a semiconductive substrate of a first conductivity-type, having first and second major surfaces,
    (b) a plurality of adjacent charge-coupled-device (CCD) memory cells including input, output, and intermediate CCD cells therebetween, each cell including an information storage segment and being further defined by separate pluralities of clocked electrodes selectively spaced above and insulated from said substrate to define, when energized, a series of charge storage sites in said substrate, and
    (c) selected cells having in their information storage segments
        (i) a first region of a second conductivity-type adjacent to said first major surface of said substrate,
        (ii) a second region of the same conductivity-type as said substrate, and of higher impurity concentration than said substrate, directly adjacent to said first region; and
    (d) at least one unselected cell, having the same impurity concentration as said substrate;
    wherein clocking signals are applied to said pluralities of electrodes to step charge packets between successive cells including said storage sites, and said first region is adapted to accumulate charge in said selected cells to represent a first type of binary digit, said at least one unselected cell represents a second type of binary digit, and said greater impurity concentration of each said second region serves to provide a neutralizing effect on the surface potential of the substrate adjacent to the first and second regions.

2. A nonvolatile read-only memory (ROM) structure having selectively spaced regions that store charge in a substrate, comprising:
    (a) a semiconductive substrate of a first conductivity-type, having first and second major surfaces,
    (b) a plurality of adjacent charge-coupled-device (CCD) memory cells including input, output, and intermediate CCD cells therebetween, each cell including an information storage segment and being further defined by separate pluralities of clocked electrodes selectively spaced above said substrate so as to define, when energized, a series of charge storage sites in said substrate,
    (c) selected cells having in their information storage segments
        (i) a first ion-implanted or diffused region of a second conductivity-type adjacent to one of said surface portions of said substrate and directly beneath a selected one of said clocked electrodes,
        (ii) a second ion-implanted or diffused region region of the same conductivity-type as said substrate, and higher in impurity concentration than said substrate, directly adjacent to said first region; and
    (d) at least one unselected cell, having the same impurity concentration as said substrate;
    wherein clocking signals are applied to said clocked electrodes to step charge packets between successive storage sites, and said first region is adapted to accumulate charge in said selected cells to represent ROM non-volatile memory information corresponding to a first type of binary digit, said at least one unselected cell represents a second type of binary digit, and said greater impurity concentration of said second region provides a neutralizing effect on the surface potential of said substrate portions directly beneath one of said clocked electrodes and above said first and second regions.

3. A system for providing nonvolatile storage of information, said system comprising:
    (a) a semiconductive substrate of a first conductivity-type having first and second major surfaces,
    (b) a plurality of adjacent charge-coupled-device (CCD) memory cells including input, output, and intermediate CCD cells therebetween, each cell including an information storage segment and being further defined by separate pluralities of clocked electrodes selectively spaced above said substrate to define, when energized, a series of charge storage sites in said substrate, (c) input circuit means coupled to said input cell for providing charge thereto, (d) output circuit means coupled to said output cell for converting binary information therefrom, (e) means for feeding back the information from said output circuit means to said input circuit means, (f) selected cells having in their information storage segments
  (i) a first ion-implanted or diffused region of a second conductivity-type adjacent to one of said surface portions of said substrate and directly beneath a selected one of said clocked electrodes,
  (ii) a second ion-implanted or diffused region region of the same conductivity-type as said substrate, but higher in impurity concentration than said substrate, directly adjacent to said first region, and (g) at least one unselected cell, having the same impurity concentration as said substrate;

wherein clocking signals are applied to said clocked electrodes to step charge packets between successive storage sites, and said first region is adapted to accumulate charge in said selected cells to represent ROM non-volatile memory information corresponding to a first type of binary digit, said at least one unselected cell represents a second type of binary digit, and said greater impurity concentration of said second region provides a neutralizing effect on the surface potential of said substrate portions directly beneath selected ones of said clocked electrodes and above said first and second regions.

4. The invention defined in any one of claims 1–3 above wherein:

(a) said semiconductor substrate has a resistivity between 0.01 and $10^{14}$ ohm cm, (b) said first region at the surface of said substrate has an impurity concentration of between $1 \times 10^{12}$ and $1 \times 10^{20}$ charge carriers per cubic centimeter, and (c) said second region beneath said first region has an impurity concentration of between $1 \times 10^{12}$ and $1 \times 10^{20}$ charge carriers per cubic centimeter and is approximately equal in carrier concentration to that of said first region, so that the charge and polarity of said first and second regions have opposing and neutralizing effects on the surface potential of said semiconductor substrate so that said substrate may contain a diffused or implanted fixed charge necessary for ROM operation without significantly and adversely changing the surface potential of said substrate and thus clocked CCD operation thereof.

5. A nonvolatile read-only memory (ROM) structure comprising:

(a) a semiconductor substrate of a first conductivity-type;

(b) a charge flow channel in said substrate divided into a serial plurality of charge storage cells, each cell having an information storage segment, and selected cells having in their information storage segments
  (i) a first region of said first conductivity-type and having a greater impurity concentration than said substrate; and
  (ii) a second region located directly adjacent said first region, of a second conductivity-type opposite to that of said first conductivity-type;

with remaining portions of said information storage segments of said selected cells, and with said at least one unselected cell, including their information storage segments, having the same impurity concentration as said substrate;

said second regions being adapted to accumulate charge in the selected cells to represent a first type of binary digit, said at least one unselected cell representing a second type of binary digit, and the greater impurity concentration of each of said first region serving to provide a neutralizing effect on the surface potential of the substrate adjacent to the first and second regions.

6. A nonvolatile read-only memory (ROM) structure comprising:

(a) a semiconductor substrate of a first conductivity-type;

(b) a plurality of clocking electrodes selectively spaced above said semiconductor substrate;

(c) a charge flow channel in said substrate divided into a serial plurality of charge storage cells, each cell having an information storage segment, and selected cells having in their information storage segments
  (i) a first ion-implanted or diffused region of said first conductivity-type and having a greater impurity concentration than said substrate; and
  (ii) a second ion-implanted or diffused region located directly adjacent said first region, of a second conductivity-type opposite to that of said first conductivity-type;

with remaining portions of said information storage segments of said selected cells, and with at least one unselected cells, including their information storage segments, having the same impurity concentration as said substrate;

said second region being adapted to accumulate charge in a selected cell to represent one type of binary digit as a transferrable charge packet, and the greater impurity concentration of each said first region serving to provide a neutralizing effect on the surface potential of the substrate adjacent to the first and second regions so that said transferrable charge packet is capable of being transferred serially through said charge flow channel beneath said plurality of discrete electrodes by sequentially applying clocking signals to said plurality of discrete electrodes.

7. A programmable charge-coupled device nonvolatile read-only-memory structure comprising:

(a) a semiconductor substrate of a first conductivity-type;

(b) a charge flow channel in said substrate divided into a serial plurality of charge storage cells, each cell including an information storage segment, with selected cells having in their information storage segments
  (i) a first region of said first conductivity-type and having a greater impurity concentration than said substrate; and (ii) a second region located directly above said first region, of a second conductivity-type opposite to that of said first conductivity-type;

with remaining portions of said information storage segments of said selected charge storage cells, and with remaining at least one unselected charge storage cells, including their information storage segments, having the same impurity concentration as said substrate; and (c) a plurality of discrete electrodes individually overlying said charge storage cells, a separate electrode overlying the information storage segment of each cell;

wherein a charge accumulates in said second region of each selected cell as a transferrable charge packet to represent one type of binary digit, and said greater impurity concentration of each said first region provides a neutralizing effect on the surface potential of said substrate above each said first and second regions, so that said transferrable charge packet is capable of being transferred serially through said charge flow channel beneath said plurality of discrete electrodes by sequentially applying clocking signals to said plurality of discrete electrodes.

8. The programmable charge-coupled device nonvolatile read-only-memory structure of claim 7 in which:

said semiconductor substrate has a resistivity between 0.01 and $10^{14}$ ohm-centimeters;

said first region has impurity concentration in the range of $10^{12}$ to $10^{20}$ charge carriers per cubic centimeter; and said second region has an impurity concentration in the range of $10^{12}$ to $10^{20}$ charge carriers per cubic centimeter.

* * * * *